United States Patent [19]
Albers et al.

[11] Patent Number: 5,153,532
[45] Date of Patent: Oct. 6, 1992

[54] NOISE GENERATOR USING COMBINED OUTPUTS OF TWO PSEUDO-RANDOM SEQUENCE GENERATORS

[75] Inventors: Steven C. Albers, Shoreview; Timothy J. Callaghan, Roseville; William L. Rasmussen, Brooklyn Center; Robert A. Pajak, Ham Lake, all of Minn.

[73] Assignee: Honeywell Inc., Minneapolis, Minn.

[21] Appl. No.: 356,891

[22] Filed: May 24, 1989

[51] Int. Cl.⁵ .............................................. H03K 3/84
[52] U.S. Cl. ..................................... 331/78; 364/717
[58] Field of Search .................. 331/78; 364/717; 328/59; 342/14, 168

[56] References Cited
U.S. PATENT DOCUMENTS

| | | | |
|---|---|---|---|
| 4,341,925 | 7/1982 | Doland | 364/717 X |
| 4,653,920 | 3/1987 | Green | 356/350 |

OTHER PUBLICATIONS

VanNostrand's Scientific Encyclopedia, Fifth Edition, 1976 "Noise Generator".
"Pseudo-Random Bit Sequences and Noise Generation," *The Art of Electronics*, Cambridge University Press, 1980, pp. 437–446.
Coekin et al, "The Generation of Pseudo-Random Binary Sequences for Testing Very Wide Band Systems", Electronic Instrumentation Conference, Hobart, Australia, May 17–19, 1972, pp. 173–177.

*Primary Examiner*—Siegfried H. Grimm
*Attorney, Agent, or Firm*—Robert A. Pajak

[57] ABSTRACT

The pseudo-random-bit sequence generators are clocked by separate clock signals of different frequency. The two pseudo-random-bit sequence generator outputs are logically combined by an exclusive-or gate to provide a pseudo-random-bit sequence generator which, when converted to analog signal has improved white noise characteristics.

14 Claims, 2 Drawing Sheets

NOISE GENERATOR USING COMBINED OUTPUTS OF TWO PSEUDO-RANDOM SEQUENCE GENERATORS

BACKGROUND OF THE INVENTION

The present invention relates to a noise generator. More particularly, it relates to pseudo-random-bit sequence generators.

In the prior art, random noise signals have been provided by analog noise generators, for example noise diodes and resistors, to generate white Gaussian noise. Alternatively, low pass filtering of the output of a pseudo-random-bit sequence generator (PRSG) also produces noise approximating white Gaussian noise characteristics. Pseudo-random-bit sequence generators typically produce a binary signal having a bit pattern with a finite, though long, pseudo-random-bit repeat sequence.

An example of a structure for a PRSG includes a single shift register. The shift register includes a plurality of memory cells or bit registers. The input to the first bit-register is sequentially clocked through the shift register by an external clock signal. The first bit-register input signal is determined by the result of the logical operation on selected bit-register outputs of the shift register. PRSGs of the class just described have a finite repeat pseudo-random-bit sequence or pattern which is generally related to the size of the PRSG's shift register. The elapsed time for the generation of the finite repeat sequence, of course, depends on the PRSG's input clock signal frequency.

An example of a PRSG is illustrated and described in The Art of Electronics (Cambridge University Press, 1980, p437-446). As described therein, the repeat sequence of an m-bit shift register is $2^m - 1$. For example, in a PRSG comprised of a 4-bit register, the pseudo random sequence or bit pattern repeats itself every 15 clock cycles. It is not uncommon for PRSGs to use a 17-bit register which repeats every 131,071 cycles.

Consequently, a shift register of large bit capacity has a long repeat sequence, and an even longer repeat sequence could be achieved by serially connecting many shift registers of large bit capacity. However, registers of very large capacity are generally very costly. Further, the desired approximation of the white-noise-like signal characteristics of noise generators utilizing very long PRSG repeat sequences deteriorates, i.e., resembles less than a true white noise distribution characteristic.

SUMMARY OF THE INVENTION

The object of the present invention is to provide a pseudo-random-bit-sequence generator having long repeat sequences.

Another object of the invention is to provide a pseudo-random-bit-sequence generator having improved resemblance to a true white noise distribution characteristic.

In the present invention, the outputs of two pseudo-random-bit sequence generators are in turn logically operated on by an EXCLUSIVE-OR gate, thereby providing the desired pseudo-random-bit-sequence in accordance with the present invention.

DESCRIPTION OF THE INVENTION

Figure 1:
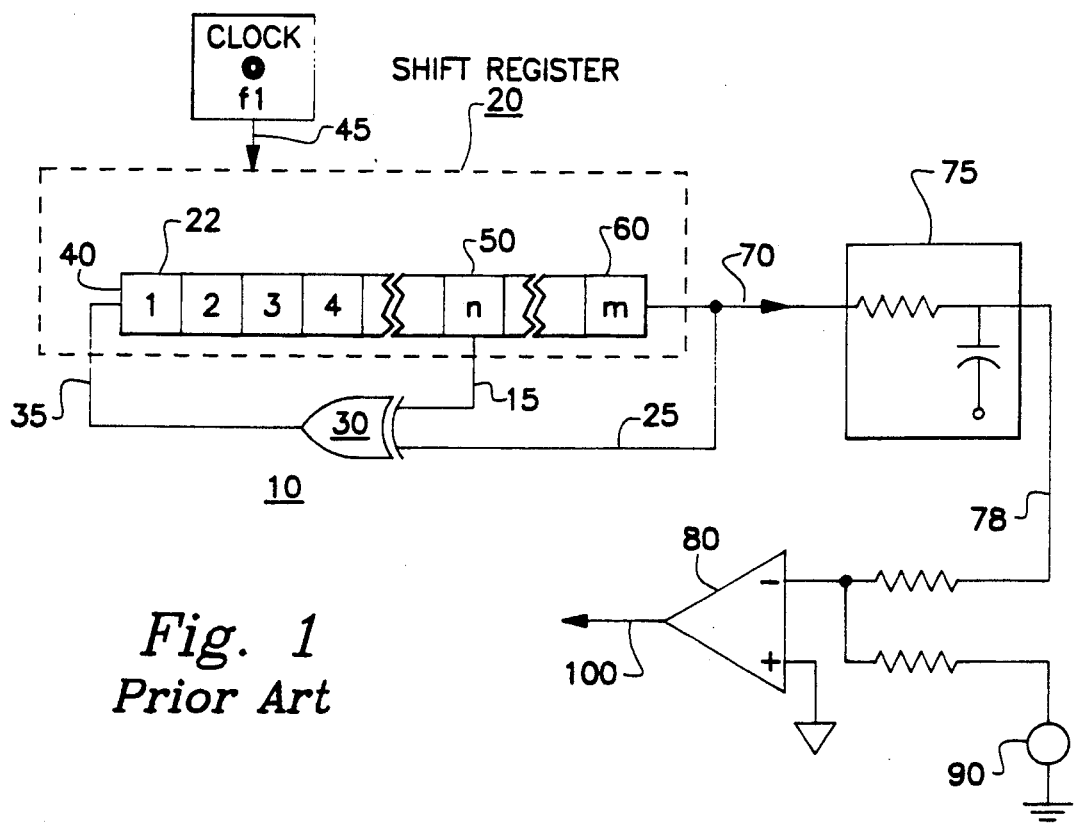
FIG. 1 is a circuit block diagram of a prior art pseudo-random-noise generator utilizing a single pseudo-random-bit sequence generator (PRSG).

Referring to the drawings in more detail, there is shown in FIG. 1 a circuit block diagram of a pseudo-random-bit-sequence generator (PRSG) 10 of the prior art as shown and described in the above referred to publication.

Illustrated in FIG. 1 is an m-bit shift register 20. The output of the nth bit-register 50 output and the output of the its last (mth) bit-register 60 are separately presented to the two inputs of an EXCLUSIVE-OR (XOR) gate 30 via leads 15 and 25, respectively. The output from XOR gate 30 is fed into input 40 of the 1st bit-register 22 via lead 35. Clock signal generator 44 provides clock signal 45 to shift register 20.

When shift register 20 is clocked at a fixed rate by a clock signal 45 at frequency F1, XOR gate 30 produces a serial output which is fed back into bit-register 22. The signal o lead 35 results from the logical operation by XOR gate 30 on the nth bit-register 50 output and the mth bit-register 60 output.

As PRSG 10 is clocked by clock signal 45, output 70, the output of the mth-bit-register 60, provides a pseudo-random-bit-sequence as is known in the art. The bit sequence at output 70 eventually repeats itself after $2^m - 1$ clock pulses or cycles. Thus, the repeating pseudo-random-bit-sequence length (S) is $2^m - 1$ cycles, and the repeat time period or interval (T) is the repeat sequence divided by the input clock frequency (F).

Generally, the output of the PRSG is coupled to some type of integrating or differentiating circuit for producing the desired analog noise signal which approximates a white noise distribution characteristic. The white noise distribution characteristic is, of course, dependent upon the output of the pseudo-random-bit sequence produced by the PRSG as well as the clock frequency. FIG. 1 illustrates the output of a PRSG 10 being passed through a low pass filter 75 (an example of an integrating circuit) thereby providing the desired analog noise signal 78. In turn, the analog noise signal 78 may be used directly or combined in summing circuit 80 with a source signal 90 to provide the resultant signal 100 being the source signal 90 with superimposed random noise signal 78.

Figure 2:
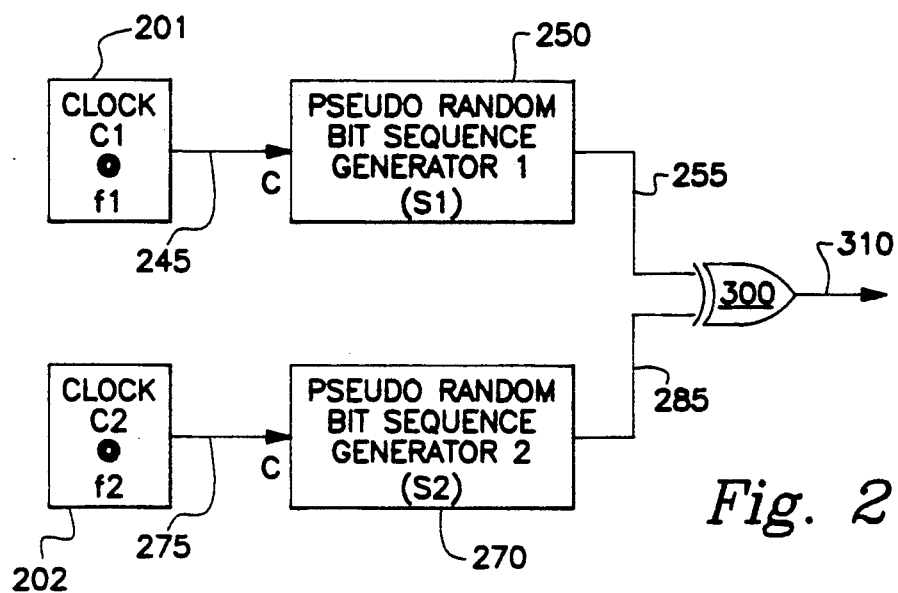
FIG. 2 is a circuit block diagram of a pseudo-random-bit sequence generator in accordance with the present invention.

FIG. 2 illustrates a pseudo-random-bit-sequence generator in accordance with the present invention. Two independent PRSG's, PRSG1 and PRSG2, identified by numerals 250 and 270 respectively, are separately driven by clock signals C1 and C2, respectively. Clock signal generator 201 provides clock signal C1 at frequency F1, and clock signal generator 202 provides clock signal C2 at frequency F2. PRSG1 provides the pseudo-random-binary-sequence on signal line 255; and PRSG2 provides the pseudo-random-binary-sequence on signal line 285. The outputs of PRSG1 and PRSG2 are logically operated on by EXCLUSIVE-OR (XOR) gate 300 whose output becomes the novel pseudo-random-bit-sequence of the present invention as will be more fully described.

The operation of the present invention as illustrated in FIG. 2 will now be described. In the following discussion, assume that clock signal frequencies F1 and F2 are different, and that F1 is slower than F2, and that the pseudo-random-bit sequence of generators PRSG1 and PRSG2 are the same. In this situation the pseudo-random-bit-sequence of PRSG2 will repeat before the pseudo-random-bit-sequence of PRSG1 repeats.

In the present invention, the output of XOR 300 is a pseudo-random-bit-sequence which repeats when:

$$\frac{N1 * S1}{F1} = \frac{N2 * S2}{F2}$$

Where,

F1, F2 are the frequencies of clock signals C1 and C2, respectively,

S1, S2 are the repeat sequences of PRSG1 and PRSG2, and

N1 is the lowest integer number of complete sequences of S1 at frequency F1 occurring in the same total time that it takes to complete N2 integer number of complete sequences of S2 at frequency F2.

If S1 and S2 are equal, then the length of the pseudo-random-bit sequence provided at the output of XOR gate 300 will be N1 times S1 under the condition that N1 and N2 define the lowest integer ratio of the frequencies F1 and F2.

Similarly, if frequencies F1 and F2 are equal, then the length of the pseudo-random-bit sequence provided at the output of XOR gate 300 will be N1 times S1 under the condition that N1 and N2 define the lowest integer ratio of the pseudo-random-bit sequences S1 and S2.

Figure 3:
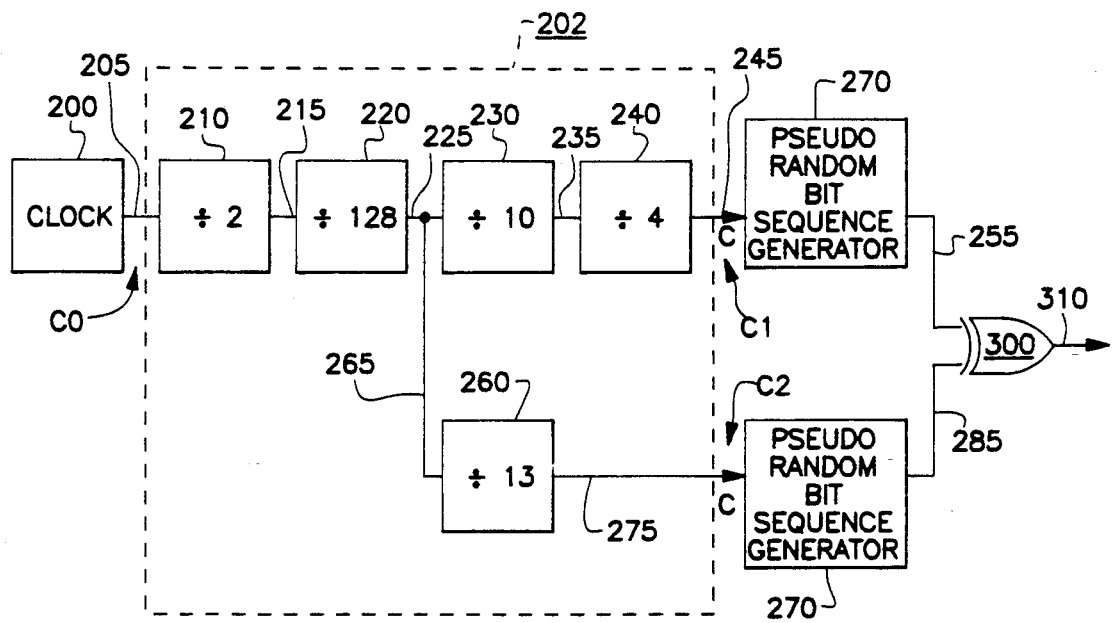
FIG. 3 is a circuit block diagram of a pseudo-random-bit sequence generator of one embodiment of the present invention.

In one embodiment of the invention, as particularly illustrated in FIG. 3, a clock signal generator 200 provides a clock signal C0 having a 7.65 MHz clock frequency. The output of clock signal generator 200 is connected to a divide-by-two (½) frequency divider circuit 210 via lead 205. Circuit 210 is connected to a divide-by-one-hundred-twenty-eight (1/128) frequency divider circuit 220 via lead 215. Circuit 220 is connected to a divide-by-ten (1/10) frequency divider circuit 230 via lead 225, and also to divide-by-thirteen (1/13) frequency divider circuit 260 via lead 265. Circuit 230 is connected to divide-by-four (¼) frequency divider circuit 240 via lead 235. The output of circuit 240 provides clock signal C1 at frequency F1 on lead 245, and the output of circuit 260 provides clock signal C2 at frequency F2 on lead 275.

Clock signals C1 and C2 are separately provided as the clock input signals to pseudo-random-bit-sequence generators PRSG1 and PRSG2 respectively, via leads 250 and 270, respectively. The output from PRSG 250 provides one input to XOR gate 300 via lead 255, and the output from PRSG 270 provides the other input of XOR gate 300 via lead 285. The resulting output 310 from XOR gate 300 is the desired pseudo-random-bit-sequence signal as will be further described.

In the present invention, clock signal frequencies F1 and F2 are preferably related by a non-integer ratio (for example, 1:1.2). When the two clock signals are derived from a single clock signal, the two derived clock signals ar preferably non-integer multiples of each other. The circuit means illustrated in FIG. 3 is such that the resulting output clock signals C1 and C2 from circuits 240 and 260, respectively, are not integer multiples of each other, and have a ratio of 13:40.

In the embodiment of the invention as illustrated in FIGS. 2 and 3, PRSG1 and PRSG2 are identical and are 17 bit registers. In this situation, the repeat sequence for PRSG1 and PRSG2 is 130,171 cycles. Further, the repeat sequence presented to XOR gate 300 will repeat after 13 repeat sequences of PRSG1 in the same time that it takes for 40 repeat sequences of PRSG2 to occur. This is so since frequency F1 is slower than frequency F2. Lastly, the repeat time interval will be equal to the repeat sequence S1 divided by the resulting clock frequency presented as the input to PRSG1 multiplied by N1, in this case being 13.

In the present invention, it should be understood XOR gate 300 functions to provide a product signal of two pseudo-random-bit-sequences provided by PRSG1 and PRSG2, and in which the separate pseudo-random-bit-sequences ar driven and synchronized with clock signal frequencies F1 and F2. In other words, XOR gate 300 serves as a frequency mixer or frequency/phase modulator in which the modulation is a pseudo-random-bit sequence at a selected frequency For example, the higher frequency PRSG2 output is passed through XOR gate 300 and is modulated by the random lower frequency output signal provided by PRSG2.

Another way of describing the function of XOR gate 300 is that pseudo-random-bit-sequence output of PRSG2 at the higher frequency is phase inverted in accordance with the pseudo-random-bit-sequence provided by PRSG1 at the lower frequency. Thus, the output of XOR-gate 300 provides a pseudo-random-bit-sequence having randomly varying bit sequence widths.

When the output of XOR-gate 300 is converted to an analog signal in a manner as previously described, it is believed that this random modulation of one pseudo-random-bit-sequence by another is what produces excellent white noise heretofore unknown in the art.

The components of the just described embodiment of the invention of FIG. 3 is only exemplary, and may be provided by a wide variety of circuits. Specifically, the aforementioned frequency divider circuits, for example, circuit 210, may be constructed using common circuit elements, as is well known. Further, the clock signals may be digitally derived from a computer, and the like. PRSG1 and PRSG2 may be constructed of the type shown and described with reference to FIG. 1 or by other means. Of course, the entire circuit may be implemented by computer techniques, micro-processors, and the like, all of which are within the spirit and scope of the present invention.

From the above description, therefore, it should be understood that two PRSGs are independently driven from two clock signals derived from a single, common source. The two PRSGs, in turn, provide two pseudo-random-bit-sequences having different repeat sequence intervals since they are driven by two different clock frequencies. In the present invention, the two PRSGs may have the same repeat sequence or may have different repeat sequences.

Figure 4:
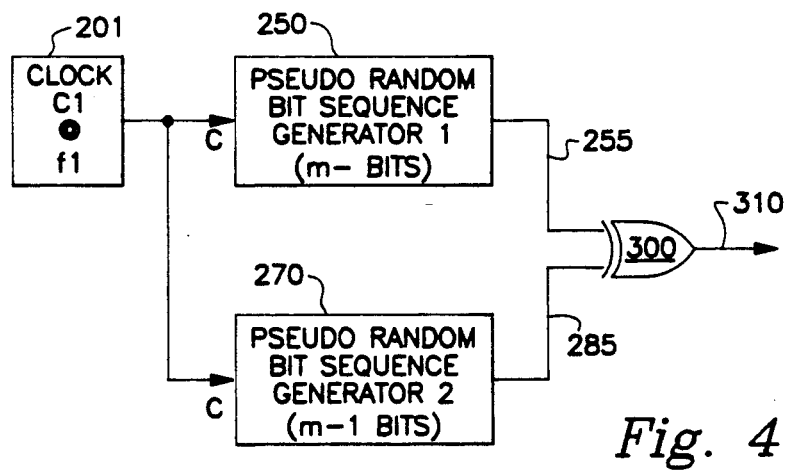
FIG. 4 is a circuit block diagram of a pseudo-random-bit sequence generator of another embodiment of the present invention.

FIG. 4 illustrates another embodiment of the present invention in which the two pseudo-random-bit-sequence generators PRSG1 and PRSG2 have different repeat sequences. For example, PRSG1 is a 17-bit register and PRSG2 is a 16-bit register. The ratio of the multiples of the repeat sequences S1 and S2 of PRSG1 and PRSG2, respectively, would be an integer ratio of the repeat sequences. With registers as aforesaid, the ratio of N1:N2 would be:

65,535:131,071

Thus, the repeat sequence for this situation is equal to N1 times S1 where N1=65,535 and S1=131,071. Thus, the pseudo-random-bit sequence can become very long.

Referring now to FIG. 2, the combination of different repeat sequences, S1 and S2, and different clock signal frequencies, F1 and F2 driving PRSG1 and PRSG2 achieves very long repeat sequences. When the pseudo-random-bit sequence of the present invention is converted to an analog signal, the resultant noise approaches white noise distribution characteristics. The excellent noise characteristics are thought to be due to the modulating or mixing effect caused by the two different clocking frequencies.

It should be noted that the above mentioned publication is herein incorporated by reference thereto, and is made part of the present application.

It should be noted that PRSGs may be constructed in various other ways to perform the same intended function, all of which are within the spirit and scope of the present invention. It should be recognized by those skilled in the art that the block diagram of the present invention illustrated in FIGS. 1 and 2 could be entirely implemented by a digital computer since the block diagram is a configuration of digital circuits which may be performed by a computer or microprocessor. Specifically, two pseudo random bit sequences at two different frequencies could be internally generated by a computer and subsequently logically operated on to perform the exclusive or function.

It should be understood by those skilled in the art that references to specific numeric values above constitute only one possible embodiment of the present invention. Further, although the present invention has been illustrated with two pseudo-random-bit sequence generators, two or more may have their outputs logically operated on or mixed to provide the named pseudo-random-bit sequence in accordance with the present invention.

The embodiments of the invention in which an exclusive property or privilege are claimed are defined as follows:

1. A pseudo-random-bit-sequence generator comprising:
   means for generating a first signal of a first frequency;
   means for generating a second signal of a second frequency different than said first frequency;
   a first signal generator, responsive to said first signal, for providing a first pseudo random output signal having a first pseudo-random-bit-sequence having a first selected repeat sequence length which repeats after a selected number of cycles of said first frequency; and
   a second signal generator, responsive to said second signal, for providing a second pseudo random output signal having a second pseudo-random-bit-sequence having a second repeat sequence length which repeats after a selected number of cycles of said second frequency; and
   logic means, having an output, a first input for receiving said first pseudo random output signal, and a second input for receiving said second pseudo random output signal, said logic means operative for logically operating on said first and second pseudo random output signals and providing a third pseudo random output signal having a pseudo-random-bit sequence which is a function of said first and second clock signal frequencies, and said first and second pseudo-random-bit sequences.

2. The pseudo-random-bit sequence generator of claim 1 wherein said first and second frequencies are non-integer factors of each other.

3. The pseudo-random-bit sequence generator of claim 1 wherein said first and second repeat sequence lengths are different.

4. The pseudo-random-bit sequence generator of claim 1 wherein said logic means performs the exclusive-or function, and said third signal is the exclusive-or function of said first and second pseudo random output signals.

5. The pseudo-random-bit sequence generator of claim 1 wherein said logic means is an EXCLUSIVE-OR gate.

6. A pseudo-random-bit sequence generator comprising:
   a signal source for providing a first signal of a first frequency; and
   first means for operating on said first signal and deriving, therefrom, a second signal of a second frequency and a third signal of a third frequency different than said second frequency;
   a first signal generator, responsive to said second signal, for providing a first pseudo random output signal having a first pseudo-random-bit sequence having a first selected repeat sequence length which repeats after a selected number of cycles of said second frequency; and
   a second signal generator, responsive to said third signal, for providing a second pseudo random output signal having a second pseudo-random-bit sequence having a second repeat sequence length which repeats after a selected number of cycles of said third frequency; and
   logic means, having an output, a first input for receiving said first pseudo random output signal, and a second input for receiving said second pseudo random output signal, said logic means operative for logically operating on said first and second pseudo random output signals and providing a third pseudo random output signal having a pseudo-random-bit sequence which is a function of said second and third signal frequencies, and said first and second pseudo-random-bit sequences.

7. The pseudo-random-bit sequence generator of claim 6 wherein the said second and third frequencies are non-integer factors of each other.

8. The pseudo-random-bit sequence generator of claim 6 wherein said first and second repeat sequence lengths are different.

9. The pseudo-random-bit sequence generator of claim 6 wherein said logic means performs the exclusive-or function, and said third signal is the exclusive-or function of said first and second pseudo random output signals.

10. The pseudo-random-bit sequence generator of claim 6 wherein said logic means is an EXCLUSIVE-OR gate.

11. A pseudo-random-bit sequence generator comprising:
   means for generating a first signal of a first frequency;
   means for generating a second signal of a second frequency different than said first frequency;

a first signal generator, responsive to said first signal, for providing a first pseudo random output signal; and a second signal generator, responsive to said second signal, for providing a second pseudo random output signal; and signal processing means, having an output, a first input for receiving said first pseudo random output signal, and a second input for receiving said second pseudo random output signal, said signal processing means operative for operating on said first and second pseudo random output signals and providing a third pseudo random output signal representative of the product of said first and second pseudo random output signals.

12. The pseudo-random-bit sequence generator of claim 11 wherein said signal processing means serves as a frequency mixer.

13. The pseudo-random-bit sequence generator of claim 11 wherein the said first and second frequencies are non-integer factors of each other.

14. A pseudo-random-bit generator comprising:
means for generating a first signal of a first frequency;
means for generating a second signal of a second frequency different than said first frequency;
a first signal generator, responsive to said first signal, for providing a first pseudo random output signal having a first pseudo-random-bit-sequence having a first selected repeat sequence length which repeats after a selected number of cycles of said first frequency; and
a second signal generator, responsive to said second signal, for providing a second pseudo random output signal having a second pseudo-random-bit-sequence having a second repeat sequence length different than said first repeat sequence length and said second repeat sequence repeats after a selected number of cycles of said second frequency; and
logic means, having an output, a first input for receiving said first pseudo random output signal, and a second input for receiving said second pseudo random output signal, said logic means operative for logically operating on said first and second pseudo random output signals and providing a third pseudo random output signal having a pseudo-random-bit sequence which is a function of said first and second clock signal frequencies, and said first and second pseudo-random-bit sequences.

* * * * *

UNITED STATES PATENT AND TRADEMARK OFFICE
CERTIFICATE OF CORRECTION

PATENT NO. : 5,153,532

DATED : October 6, 1992

INVENTOR(S) : Steven C. Albers; Timothy J. Callaghan; William L. Rasmussen; and Robert A. Pajak It is certified that error appears in the above-identified patent and that said Letters Patent is hereby corrected as shown below:

Claim 14, Column 7, line 25, delete "pseudo-random-bit" and insert --pseudo-random-bit-sequence--.

Abstract, Line 1, delete "The" and insert --Two--.

Signed and Sealed this

Fifth Day of October, 1993

Attest:

BRUCE LEHMAN

Attesting Officer     Commissioner of Patents and Trademarks